(12) United States Patent
Kawakami et al.

(10) Patent No.: US 9,691,913 B2
(45) Date of Patent: Jun. 27, 2017

(54) SOLAR CELL MODULE AND METHOD FOR MANUFACTURING SAME

(71) Applicant: SANYO Electric Co., Ltd., Osaka (JP)

(72) Inventors: Tsukasa Kawakami, Osaka (JP); Masahiro Iwata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/477,996

(22) Filed: Sep. 5, 2014

(65) Prior Publication Data

US 2015/0083185 A1 Mar. 26, 2015

Related U.S. Application Data

(63) Continuation of application No. PCT/JP2012/057596, filed on Mar. 23, 2012.

(51) Int. Cl.
*H01L 31/02* (2006.01)
*H01L 31/0224* (2006.01)
(Continued)

(52) U.S. Cl.
CPC .. *H01L 31/0201* (2013.01); *H01L 31/022433* (2013.01); *H01L 31/048* (2013.01);
(Continued)

(58) Field of Classification Search
CPC ........... H01L 31/022433; H01L 31/048; H01L 31/0504; H01L 31/0747; H01L 31/0201; H01L 31/0512
See application file for complete search history.

(56) References Cited

U.S. PATENT DOCUMENTS

2007/0235077 A1 10/2007 Nagata et al.
2008/0011347 A1* 1/2008 Aoyama ............. H01L 31/0201
136/244
(Continued)

FOREIGN PATENT DOCUMENTS

EP 2068372 A1 6/2009
EP 2200093 A1 6/2010
(Continued)

OTHER PUBLICATIONS void—definition of void; Merriam-webster.com; http://www.merriam-webster.com/dictionary/void; accessed and printed Jul. 29, 2016.*
(Continued)

*Primary Examiner* — Allison Bourke
*Assistant Examiner* — Edward Schmiedel
(74) *Attorney, Agent, or Firm* — Cantor Colburn LLP

(57) ABSTRACT

A solar cell module is provided with: a plurality of solar cells, each of which comprises a first electrode and a second electrode that are formed on a photoelectric conversion unit; and a wiring material that is fitted on the first electrode and the second electrode using an adhesive and connects the solar cells with each other. The adhesive is provided so as to extend beyond a region (R) directly below the wiring material and to adhere to a lateral surface of the wiring material. The solar cell module has a pore in the region (R) directly below the wiring material.

6 Claims, 5 Drawing Sheets

(51) Int. Cl.
*H01L 31/048* (2014.01)
*H01L 31/05* (2014.01)
*H01L 31/0747* (2012.01)

(52) U.S. Cl.
CPC ...... *H01L 31/0504* (2013.01); *H01L 31/0508* (2013.01); *H01L 31/0747* (2013.01); *Y02E 10/50* (2013.01)

(56) References Cited

U.S. PATENT DOCUMENTS

| | | | |
|---|---|---|---|
| 2008/0196757 | A1 | 8/2008 | Yoshimine |
| 2009/0038675 | A1* | 2/2009 | Tsunomura ......... H01L 31/0508 136/251 |
| 2009/0194144 | A1* | 8/2009 | Taira ................ H01L 31/0512 136/244 |
| 2009/0235980 | A1 | 9/2009 | Nishida |
| 2010/0006147 | A1* | 1/2010 | Nakashima ....... H01L 31/02167 136/256 |
| 2010/0116314 | A1 | 5/2010 | Fukushima et al. |
| 2010/0294329 | A1 | 11/2010 | Fukushima et al. |
| 2011/0048494 | A1* | 3/2011 | Mishima ............ H01L 31/0504 136/244 |
| 2012/0125396 | A1 | 5/2012 | Taira et al. |
| 2012/0156822 | A1 | 6/2012 | Tsunomura et al. |

FOREIGN PATENT DOCUMENTS

| | | |
|---|---|---|
| JP | 2000261012 A | 9/2000 |
| JP | 2005159173 A | 6/2005 |
| JP | 2008053681 A | 3/2008 |
| JP | 2008205137 A | 9/2008 |
| JP | 2009043801 A | 2/2009 |
| JP | 2009081217 A | 4/2009 |
| JP | 2009206493 A | 9/2009 |
| JP | 2009231387 A | 10/2009 |
| WO | 2008139994 A1 | 11/2008 |
| WO | 2009041506 A1 | 4/2009 |
| WO | 2010122875 A1 | 10/2010 |
| WO | 2011013814 A2 | 2/2011 |

OTHER PUBLICATIONS

International Search Report for Applicaiton No. PCT/JP2012/057596; Date of Mailing Jun. 5, 2012, with English Translation.
Extended European Search Report corresponding to Application No. 12871962.2-1504/2830101, PCT/JP2012057596: Date of Mailing: Mar. 11, 2015.
Japanese Office Action corresponding to Application No. 2014-505948; Date of Mailing: Mar. 1, 2016.

* cited by examiner

SOLAR CELL MODULE AND METHOD FOR MANUFACTURING SAME

CROSS-REFERENCE TO RELATED APPLICATION

The present application is a continuation under 35 U.S.C. §120 of PCT/JP2012/057596, filed on Mar. 23, 2012, which is incorporated herein by reference.

TECHNICAL FIELD

The present disclosure relates to a solar cell module and a method of manufacturing the solar cell module.

BACKGROUND ART

A solar cell module includes a plurality of solar cells, a wiring member for electrically connecting between the solar cells, and an encapsulant for sealing these materials. The wiring member can be mounted onto an electrode of the solar cell by using an adhesive (see, Patent Document 1).

PRIOR ART DOCUMENTS

Patent Documents

Patent Document 1: JP 2008-205137 A

DISCLOSURE OF THE INVENTION

Technical Problems

In a solar cell module, the above-described adhesive or the like may expand or shrink due to a temperature change at the time of manufacture or at the time of use. Such expansion or shrinkage would cause separation at the bonding interface, resulting in deficiency in electrical connection between the wiring member and the electrodes.

Solution to Problems

In accordance with an aspect of the present disclosure, a solar cell module includes a plurality of solar cells each including a photoelectric conversion unit and an electrode formed on the photoelectric conversion unit, and a wiring member mounted on the electrode by using an adhesive for connecting between the solar cells. The adhesive is provided so as to extend beyond a region immediately below the wiring material and to adhere to a side surface of the wiring member, and a void is included in the region immediately below the wiring member.

Advantageous Effects of Invention

According to the present disclosure, it is possible to provide a solar cell module which can maintain desirable connection between the wiring member and the electrodes.

BEST MODE FOR CARRYING OUT THE INVENTION

Figure 1:
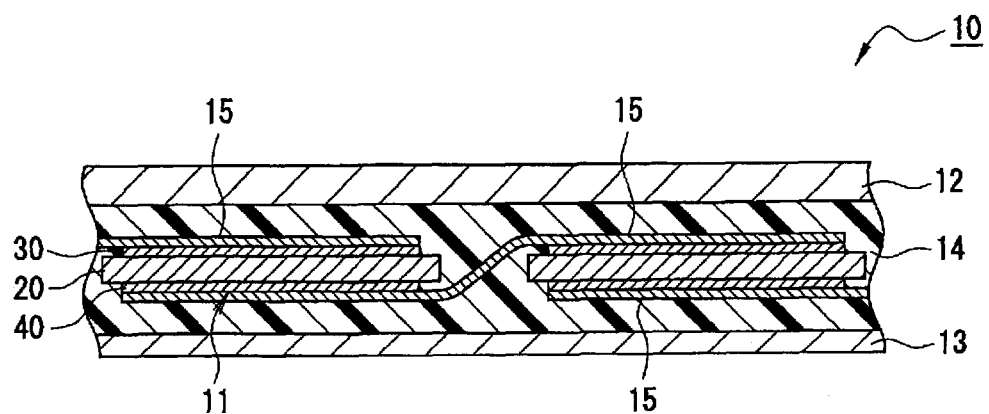
FIG. 1 Cross sectional view illustrating an example solar cell module according to an embodiment of the present disclosure.

A solar cell module 10 which is an example embodiment according to the present disclosure will be described with reference to the drawings. Drawings which will be referred to in the embodiment are schematically described, and the scale of the components illustrated in the drawings may differ from that of an actual product. The specific scale or the like should be determined in consideration of the following description.

In the present specification, unless otherwise specified, the recitation "a second object (an amorphous semiconductor layer, for example) is formed over a whole region of a first object (a substrate, for example)" is not limited to a case where the first and second objects are formed in direct contact with each other. In other words, this recitation includes a case where another object is present between the first and second objects. Further, the expression "formed over the whole region" includes a region which can be substantially regarded as a whole region (a state in which 95% of the first object is covered, for example).

Figure 2:
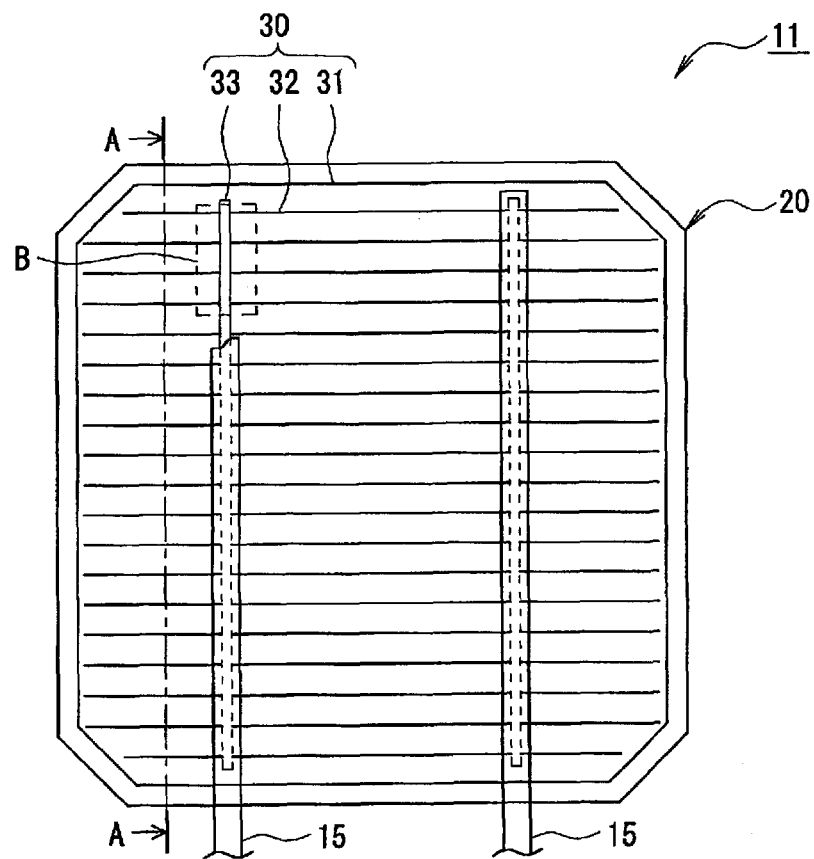
FIG. 2 Plan view of a solar cell applied to the solar cell module illustrated in FIG. 1 when viewed from a light-receiving surface side.
Figure 3:
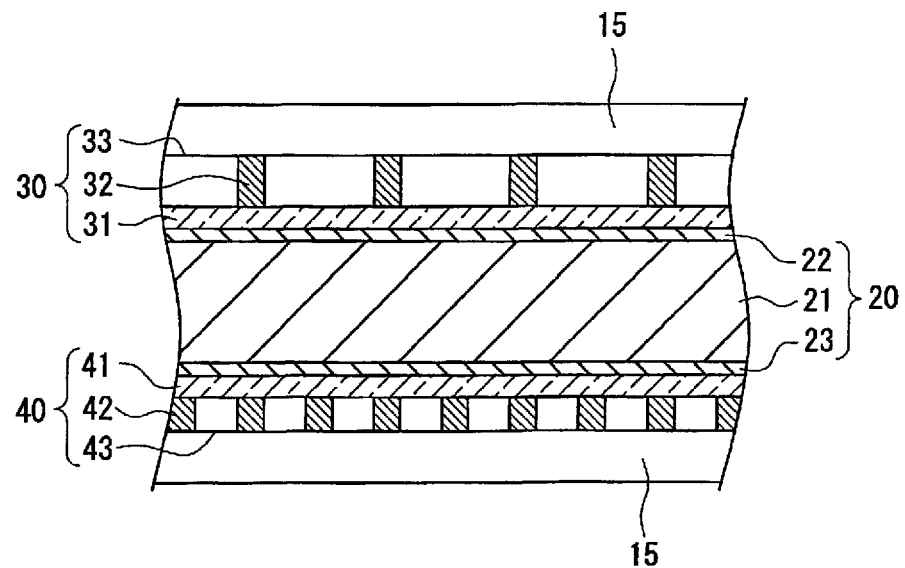
FIG. 3 View illustrating a part of a cross section taken along line A-A in FIG. 2.

Referring first to FIGS. 1 to 3, the structure of the solar cell module 10 will be described. FIG. 1 is a cross sectional view illustrating a portion of the solar cell module 10; FIG. 2 is a plan view of a solar cell 11 applied to the solar cell module 10 when viewed from a light-receiving surface side; and FIG. 3 is a view illustrating a part of a cross section taken along line A-A in FIG. 2.

The solar cell module 10 includes a plurality of solar cells 11, a first protecting member 12 disposed on the light-receiving surface side of the solar cells 11, and a second protecting member 13 disposed on the backside surface side of the solar cells 11. The plurality of solar cells 11 are interposed between the first protecting member 12 and the second protecting member 13 and are sealed with an encapsulant 14.

The solar cell module 10 further includes a wiring member 15 for electrically connecting between the solar cells 11. In addition, the solar cell module 10 generally further includes a connecting wiring member, a frame, and a terminal box (none of which are shown), for connecting between the wiring members 15.

The solar cell 11 includes a photoelectric conversion unit 20 which receives sunlight to generate carriers, a first electrode 30 which is a light-receiving surface electrode formed on the light-receiving surface of the photoelectric conversion unit 20, and a second electrode 40 which is a back surface electrode formed on the backside surface of the photoelectric conversion unit 20. The solar cell 11 is configured such that carriers generated in the photoelectric conversion unit 20 are collected by the first electrode 30 and the second electrode 40. As used herein, the "light-receiving surface" refers to a surface of the solar cell 11 which the sunlight mainly enters externally, and the "backside surface" refers to a surface opposite the light-receiving surface. For example, over 50% to 100% of sunlight entering the solar cell 11 enters through the light-receiving surface side.

The photoelectric conversion unit 20 includes a substrate 21 formed of a semiconductor material including crystalline silicon (c-Si), gallium arsenide (GaAs), indium phosphide (InP), and so on, an amorphous semiconductor layer 22 formed on the light-receiving surface of the substrate 21, and an amorphous semiconductor layer 23 formed on the backside surface of the substrate 21. An n-type single crystalline silicon substrate is particularly preferable as the substrate 21. Preferably, the light-receiving surface and the backside surface of the substrate 21 have a texture structure (not shown) including projections and depressions having a height of 1 µm to 15 µm.

The amorphous semiconductor layer 22 has a structure including a i-type amorphous silicon layer and a p-type amorphous silicon layer sequentially formed in this order, for example. The amorphous semiconductor layer 23 has a structure including a i-type amorphous silicon layer and an n-type amorphous silicon layer sequentially formed in this order, for example. The photoelectric conversion unit 20 may also have a structure including a i-type amorphous silicon layer and a n-type amorphous silicon layer sequentially formed in this order on the light-receiving surface of the substrate 21 and including an i-type amorphous silicon layer and a p-type amorphous silicon layer sequentially formed in this order on the backside surface of the substrate 21.

The first electrode 30 and the second electrode 40 include a transparent conductive layer 31, 41, respectively. The transparent conductive layer 31, 41 is formed of a transparent conductive oxide having tin (Sn) antimony (Sb), and the like doped into a metal oxide such as indium oxide ($In_2O_3$) and zinc oxide (ZnO), for example. Preferably, the transparent conductive layer 31, 41 is formed over the amorphous semiconductor layer 22 or 23 so as to cover the whole region except the end portions thereof.

The first electrode 30 further includes a plurality of (50, for example) finger electrodes 32 and a plurality of (2, for example) bus bar electrodes 33 formed on the transparent conductive layer 31 as current-collecting electrodes that collect carriers via the transparent conductive layer 31. The finger electrode 32 is a linear electrode having a narrow width formed in a wide range on the transparent conductive layer 31. The bus bar electrode 33 collects carriers from the finger electrodes 32. The first electrode 30 is configured such that the bus bar electrodes 33 are arranged in parallel to each other at predetermined intervals and the plurality of finger electrodes 32 are arranged so as to be orthogonal to the bus bar electrodes 33. The plurality of finger electrodes 32 are arranged such that a part of each of the finger electrodes 32 extends from the respective bus bar electrode 33 toward the end side of the light-receiving surface and the remaining part of the finger electrode 32 connect the respective bus bar electrodes 33.

The second electrode 40, similar to the first electrode 30, includes a plurality of (250, for example) finger electrodes 42 and a plurality of (2, for example) bus bar electrodes 43 formed on the transparent conductive layer 41. The arrangement of these electrodes is similar to that in the first electrode 30.

The finger electrodes 32, 42, and the bus bar electrodes 33, 43 (which may be hereinafter collectively referred to as a "current-collecting electrode") have a structure including a conductive filler dispersed in a binder resin. As the conductive filler, metal particles such as silver (Ag), copper (Cu), or nickel (Ni), carbon, or a mixture thereof can be used, among which Ag particles are preferable. The current-collecting electrode can be formed, for example, by a screen printing method using a conductive paste or by electroplating.

The width of the finger electrode 32 is preferably about 30 µm to 150 µm, and is more preferably about 40 µm to 100 µm, in consideration of a reduction in shadow loss. The width of the bus bar electrode 33 is preferably about 50 µm to 300 µm, and is more preferably about 80 µm to 150 µm. The heights of the finger electrode 32 and the bus bar electrode 33 (the length from the projection portion of the texture structure to the top surface of each electrode) are within the range of about 40 µm to 150 µm, in consideration of a reduction in the resistance loss and the like, and are preferably within the same range. It is desirable that the finger electrodes 42 of the second electrode 40 have a width which is larger than that of the finger electrodes 32 and a height which is smaller than that of the finger electrodes 32.

The first protecting member 12 can be a member having translucency such as a glass substrate, a resin substrate, or a resin film, for example, and a glass substrate is preferable in view of durability and so on. A member similar to that of the first protecting member 12 can be used for the second protecting member 13, which is preferably a resin substrate or a resin film such as polyethylene terephthalate (PET), in view of cost reduction, weight reduction, and so on. If light received from the backside surface side is not assumed, the second protecting member 13 may be a translucent substrate or a resin film, and may be a laminate base member having laminated aluminum foil. Preferably, a resin such as ethylene-vinyl acetate (EVA) copolymer is used for the encapsulant 14, in view of adhesiveness to the solar cell 11 or the wiring member 15.

The wiring member 15 connects between the solar cells 11 disposed in adjacent to each other. One end of the wiring member 15 is attached to the first electrode 30 of one solar cell 11 of the adjacently disposed solar cells 11 and the other end of the wiring member 15 is connected to the second electrode 40 of the other solar cell 11. The wiring member 15 is bent in the thickness direction of the solar cell module 10 between the adjacent solar cells 11 to thereby connect the adjacent solar cells with each other.

Figure 4:
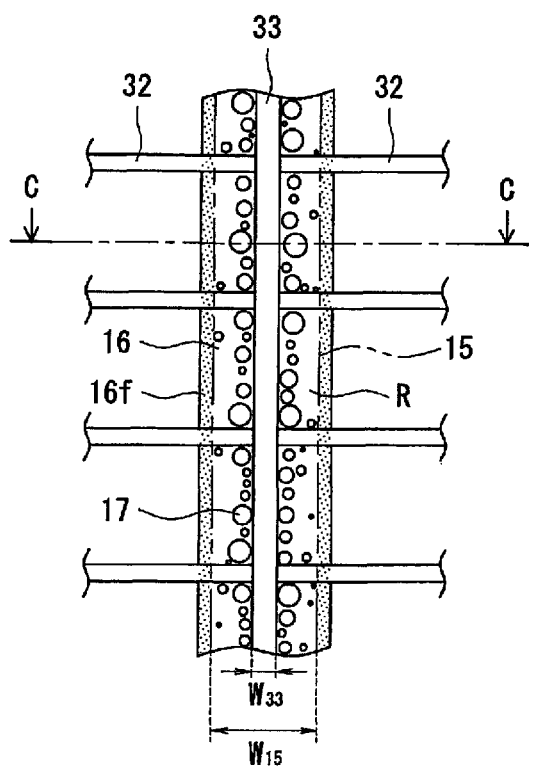
FIG. 4 Enlarged view of a portion B in FIG. 2.
Figure 5:
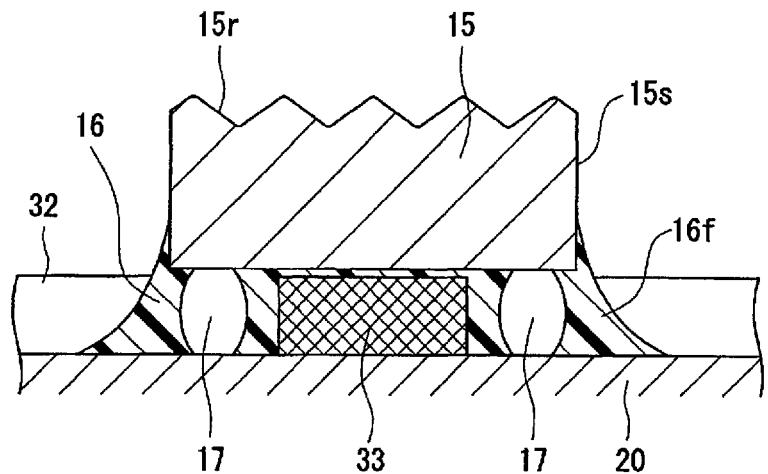
FIG. 5 View illustrating a part of a cross section (on the light-receiving surface side) taken along line C-C in FIG. 4.
Figure 6:
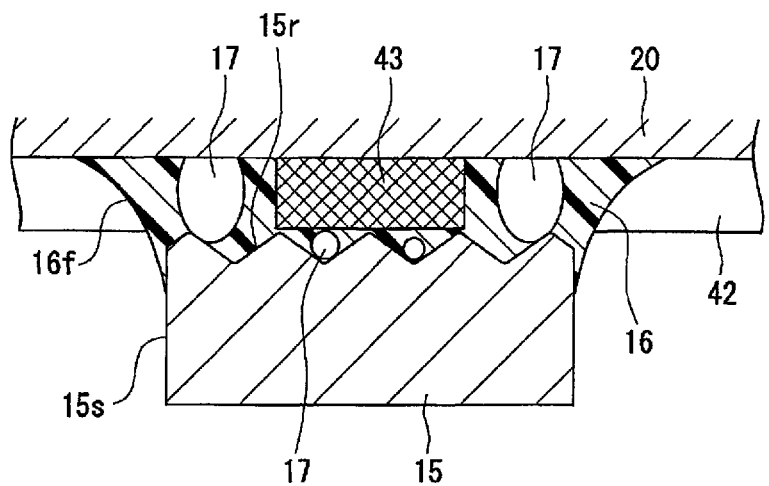
FIG. 6 View illustrating a part of a cross section (on the backside surface side) taken along line C-C in FIG. 4.

Referring to FIGS. 4 to 6, connection between the wiring member 15 and first and second electrodes 30 and 40 will be described in detail. FIG. 4 is an enlarged view of a portion B in FIG. 2. In FIG. 4, for the purpose of clarification, the wiring member 15 is illustrated only by the outline indicated by a chain double-dashed line. FIGS. 5 and 6 are views illustrating a portion of a C-C cross section in FIG. 4, viewed from the light-receiving surface side and the backside surface side, respectively.

The wiring member 15 is attached onto the first electrode 30 and the second electrode 40 by using an adhesive 16. Preferably, a thermosetting adhesive formed of, for example, an epoxy resin, an acrylic resin, a urethane resin, or the like, mixed with a curing agent, as necessary, is used for the adhesive 16. While such a resin may contain a conductive filler such as Ag particles and so on, in view of manufacturing cost and a reduction in the shadow loss, a non-conductive thermosetting adhesive is preferable. Example forms of the adhesive include a film form and a paste form.

The wiring member 15 is provided on the bus bar electrode 33 extending in a linear shape along the longitudinal direction of the bus bar electrode 33. The wiring member 15 similarly has a linearly extending shape and is disposed in a state in which the center portion in the width direction of the wiring member 15 corresponds to the center portion in the width direction of the bus bar electrode 33. While it is preferable that the width $W_{15}$ of the wiring member is small in terms of a reduction in the shadow loss, as the mechanical strength must be of such a degree that the wiring member 15 will not be broken at least during manufacturing or when in use, the width $W_{15}$ of the wiring member 15 is preferably 0.5 mm to 2.0 mm, and is more preferably 0.8 mm to 1.5 mm. In other words, the width $W_{15}$ of the wiring member 15 is preferably larger than the width $W_{33}$ of the bus bar electrode 33, such that preferably $W_{15}/W_{32}$ is about 2 to 15, and is more preferably about 5 to 10. The wiring member 15 is attached so as to extend beyond both end sides of the bus bar electrode 33 in the width direction. Consequently, the wiring member 15 is also attached on the portion of the finger electrode 32 near the bus bar electrode 33.

The wiring member 15 has projections and depressions 15r on a surface thereof facing the first protecting member 12 side. The projections and depressions 15r have a function of diffusing light emitted onto the wiring member 15. As the light diffused by the projections and depressions 15r is reflected once again toward the solar cell 11 side by the first protecting member 12, it is possible to enhance the light-receiving efficiency of the solar cell 11. The height of the projections and depressions 15r (the length along the thickness direction from the depression portion to the projection portion) is preferably about 10 μm to 50 μm. The wiring member 15 has no projections and depressions 15r on a surface facing the second protecting member 13 side and the surface is therefore flat. As such, the wiring member 15 has a flat surface opposite the bus bar electrode 33 and has the projections and depressions 15r on the surface opposite the bus bar electrode 43.

The adhesive 16 is provided in a region R immediately below the wiring member 15 (which will be referred to as an "immediately below region R"). More specifically, the adhesive is provided between the wiring member 15 and the current-collecting electrodes and between the wiring member 15 and the photoelectric conversion unit 20. The adhesive 16 interposed between the wiring member 15 and the current-collecting electrodes of the first electrode 30 is small in quantity and has a thickness of about several nm to several hundred nm. The adhesive 16 interposed between the wiring member 15 and the current-collecting electrodes of the second electrode 40 is greater in quantity than that of the adhesive on the first electrode 30 side because of the projections and depressions 15r of the wiring member 15, and is preferably provided so as to fill the depression portions of the projections and depressions 15r.

The adhesive 16 extends beyond the immediately below region R and adheres to a side surface 15s of the wiring member 15. The "side surface 15s" refers to a surface of the wiring member 15 along the thickness direction. More specifically, in a state in which the wiring member 15 and the current-collecting electrodes are connected, a fillet 16f (dotted portion in FIG. 4) corresponding to a portion of the adhesive 16 extending beyond the immediately below region R is formed. The fillet 16f is formed by the adhesive 16 which is extruded from the immediately below region R when the wiring member 15 is subjected to thermocompression bonding.

The fillet 16f is preferably formed on both sides in the width direction of the wiring member 15 along the edge of the wiring member 15. The fillet 16f partially covers the side surface 15s of the wiring member 15 to thereby bond the side surface 15s directly with the light-receiving surface and the backside surface of the photoelectric conversion unit 20. With this structure, it is possible to enhance the adhesion force as compared to the case where the wiring member 15 is bonded only in the immediately below region R, and also to prevent the encapsulant 14 from entering the immediately below region R.

When the adhesive 16 has no translucency, the width of the fillet 16f is preferably about 50 μm to 300 μm, for example, and is preferably narrower when the adhesive 16 has translucency.

The solar cell module 10 includes a void 17 in the immediately below region R of the wiring member 15. A plurality of voids 17 are present in the immediately below region R and are formed, for example, by introducing air into the adhesive 16 or introducing air between the adhesive 16 and the current-collecting electrodes. As the void 17 is surrounded by the adhesive 16, it can be considered that the void 17 is formed in the adhesive 16. The void 17 can be identified by observing the adhesive 16 under a scanning electron microscope (SEM) after separating the wiring member 15 from the current-collecting member. FIG. 4 illustrates an SEM image of the adhesive 16 observed in a plan view after separation of the wiring member 15.

The void 17 has a function of absorbing a stress generated by thermal expansion and associated shrink of the adhesive 16 to thereby mitigate effects thereof, in order to prevent separation of the wiring member 15 and the current-collecting electrode from each other at the contact interface therebetween (an interface between the wiring member 15 and the adhesive 16, and an interface between the adhesive 16 and the current-collecting electrode). Further, with the void 17, the adhesive 16 can be extruded out from the immediately below region R to form the fillet 16f efficiently. While the void 17 is preferably provided in the immediately below region R, the void 17 may be present in the fillet 16f.

Many of the voids 17 are formed in the immediately below region R between the wiring member 15 and the photoelectric conversion unit 20. The void 17 has a substantially circular shape in a plan view and preferably has a size (diameter) of about 40 μm to 150 μm. The void 17 may, for example, communicate from the wiring member 15 through the photoelectric conversion unit 20.

The void 17 is formed in the immediately below region R along the edges of the bus bar electrodes 33 and 43. For example, a plurality of voids 17 are formed in lines along the edges of the bus bar electrodes 33 and 43. The voids 17 are formed at a higher density along the edges of the bus bar electrodes 33 and 43 than in other regions. Here, the edges of the bus bar electrodes 33 and 43 refer to a range of the distance from the electrode end portion which is about equal to the widths $W_{33}$ and $W_{43}$ of the electrodes. In other words, the density of the voids 17 is higher toward the center portion in the width direction of the immediately below region R than in the end portions in the width direction of the immediately below region R. With this configuration, with the effects due to variations of the volume of the adhesive 16 being sufficiently mitigated, a high adhesion force can be achieved near both end portions in the width direction of the immediately below region R, including the fillet 16f.

In the present embodiment, the voids 17 are formed in a larger number between the wiring member 15 and the current-collecting electrode on the backside surface side than on the light-receiving surface side. Alternatively, between the wiring member 15 and the current-collecting electrode, the voids are formed only on the backside surface side, because of the projections and depressions 15r of the wiring member. Specifically, the voids 17 are formed between the depression portions of the projections and depressions 15r and the current-collecting electrode of the second electrode 40. With this configuration, the advantage of the stress mitigation is remarkable on the backside surface side, so that warpage of the solar cell 11 can be suppressed. As the second electrode 40 includes more metal particle components than the first electrode 30, the stress is greater on the backside surface side of the solar cell 11 than on the light-receiving side.

Figure 7:
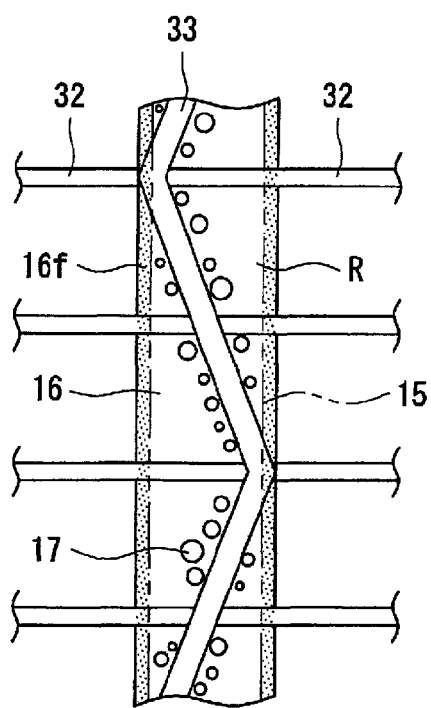
FIG. 7 View illustrating a modification example solar cell module according to the embodiment of the present disclosure.

As illustrated in FIG. 7, the bus bar electrode 33 may extend while repeating the projections and depressions and have a zigzag shape seen in a plan view. In this case, the voids 17 are similarly provided in the immediately below region R along the edge of the bus bar electrode 33. Also, the adhesive 16 extends beyond the immediately below region R to form the fillet 16f.

Figure 8:
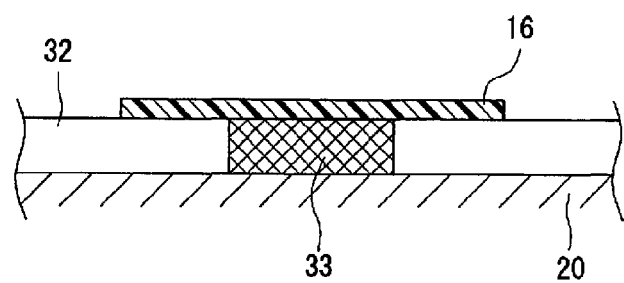
FIG. 8 View for explaining a manufacturing method of an example solar cell module according to the embodiment of the present disclosure.
Figure 8:
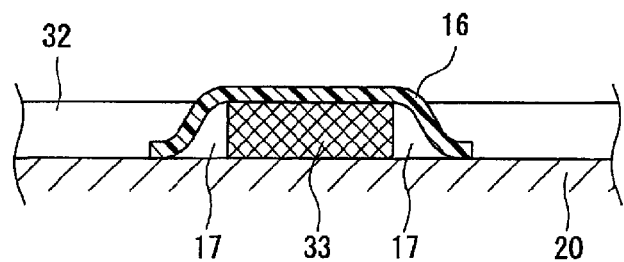
Figure 9:
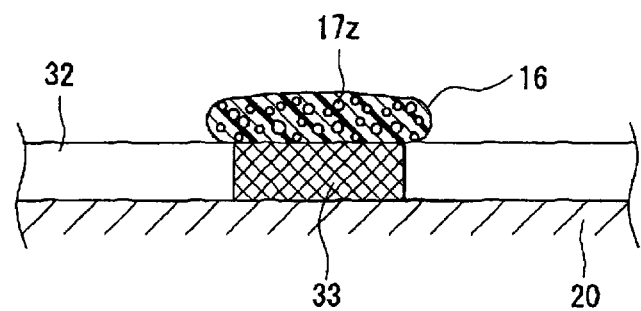
FIG. 9 View for explaining a manufacturing method of an example solar cell module according to the embodiment of the present disclosure.

An example method of manufacturing the solar cell module 10 having the structure as described above will be described in detail. Here, in order to describe a process of mounting the wiring member 15, FIGS. 8 and 9 will be referred to. FIGS. 8 and 9 are cross sectional views illustrating a process of providing the adhesive 16 on the current-collecting electrode of the first electrode 30 and introducing the voids 17 in the immediately below region R (which is similarly applied to the second electrode 40 side).

The solar cell module 10 can be manufactured through a laminating process of thermocompression bonding a laminate formed of components. In this case, the encapsulant 14 is supplied in a film shape having a thickness of about 0.1 mm to 1.0 mm, for example. During the manufacturing process of the solar cell module 10, first, the solar cell 11 is manufactured by a known method. When the solar cell 11 is provided, the wiring member 15 is mounted on the first electrode 30 and the second electrode 40 of the solar cell 11 by using the adhesive 16 so as to connect the solar cells 11 disposed adjacent to each other, thereby producing a string of the solar cells 11. For the adhesive 16, an adhesive made of a thermosetting resin in a paste or film form, for example, can be used.

FIG. 8 illustrates a state in which the adhesive 16 in a film form is used to mount the wiring member 15. In this case, as illustrated in FIG. 8(a), a film-like adhesive 16 having a width greater than that of the bus bar electrode 33 is disposed on the current-collecting electrode. Whereas conventionally thermal processing is performed in this state with the adhesive 16 being depressed by a cushioning member to thereby mold the adhesive 16 to conform to the shape of the bus bar electrode 33, such a member is not used in the present embodiment. In the present embodiment, as illustrated in FIG. 8(b), processing is performed in such a manner that air is enclosed between the adhesive 16, and the photoelectric conversion unit 20 and the current collecting electrode. An example of such a processing method can be a method of depressing the adhesive 16 by using a flat plate having a high stiffness. Alternatively, the adhesive 16 may be softened by directing hot air thereto, so that both sides of the adhesive 16 may be hung down under its own weight. The thermal processing is performed at such a temperature that the adhesive 16 is soften and is not cured.

FIG. 9 illustrates a case in which the adhesive 16 in a paste form is used to mount the wiring member 15. In this case, a paste-like adhesive 16 containing air 17z which will form the void 17 is used. Such an adhesive 16 is applied onto the bus bar electrode 33 by a dispenser and the like. The paste-like adhesive 16 containing air 17z can be formulated by, for example, stirring, in the air, a paste which has been adjusted to such a viscosity that can hold the air 17z therein and can be applied. The formulated adhesive 16 is applied without performing deaeration processing.

During the mounting process of the wiring member 15, the wiring member 15 is placed on the adhesive 16, which has been processed or applied as described above, for thermocompression bonding. The heating temperature is set to a temperature at which the adhesive 16 will be cured. At this time, a part of the adhesive 16 existing in the immediately below region R is extruded from the immediately below region R to form the fillet 16f. A part of the voids 17 may be filled with the adhesive 16 which has not been cured. With the same quantity (weight) of the adhesive 16 to be used and under the same thermocompression bonding conditions, a greater quantity of introduced voids 17 makes it easier for the adhesive 16 to be extruded from the immediately below region R and to form the fillet 16f. In other words, according to the present manufacturing process, with the adjustment of the quantity of voids 17 to be introduced, the shape of the fillet 16f can be adjusted.

Subsequently, a first resin film forming the encapsulant 14 is formed on the first protecting member 12, and the string of the solar cells 11 is provided on the first resin film. Further, a second resin film forming the encapsulant 14 is formed on the solar cells 11 and the second protecting member 13 is laminated thereon. Then, with the respective resin films being heated at temperatures at which the resin films will be molten, a pressure is applied on the second protecting member 13 side to form a laminate of these resin films, so that a structure in which the string of the solar cells 11 is sealed with the encapsulant 14 can be obtained. Finally, a frame or a terminal box is attached, thereby producing the solar cell module 10.

As described above, the solar cell module 10 includes the voids 17 in the immediately below region R of the wiring member 15 and also includes the fillet 16f which directly bonds the side surface 15s of the wiring member 15 with the photoelectric conversion unit 20 along the edge of the wiring member 15. The voids 17 absorb the stress generated by thermal expansion and associated shrinkage of the adhesive 16 to thereby prevent separation at the bonding interface. Further, provision of the fillet 16f can enhance the adhesion force as compared to the case where bonding is achieved only in the immediately below region R of the wiring member 15.

The voids 17 enable easy control of the shape of the fillet 16f. For example, with an increase in the quantity of introduced voids 17 to thereby reduce the quantity of adhesive 16 that is used, it is possible to increase the width of the fillet 16f. With a decrease in the quantity of introduced voids 17, it is possible to reduce the width of the fillet 16f.

With the fillet 16f and so on, the adhesion force at the end portions of the immediately below region R can be enhanced, so that it is possible to prevent entry of the encapsulant 14 into the immediately below region R. The encapsulant 14 entering the immediately below region R facilitates separation of the wiring member 15 due to the thermal expansion or the like of the encapsulant 14. According to the bonding method described above, such a disadvantage can be eliminated.

As such, according to the solar cell module 10, desirable connection can be maintained between the wiring member 15 and the current collecting electrodes.

The design of the above embodiment may be modified as appropriate within a range that does not impair the object of the present disclosure.

For example, a wiring member with no projections and depressions 15r may be used. Also, in place of the finger electrodes 42, a metal layer may be provided over the entire region on the transparent conductive layer 41.

The photoelectric conversion unit may have a structure other than the structure described above.

Figure 10:
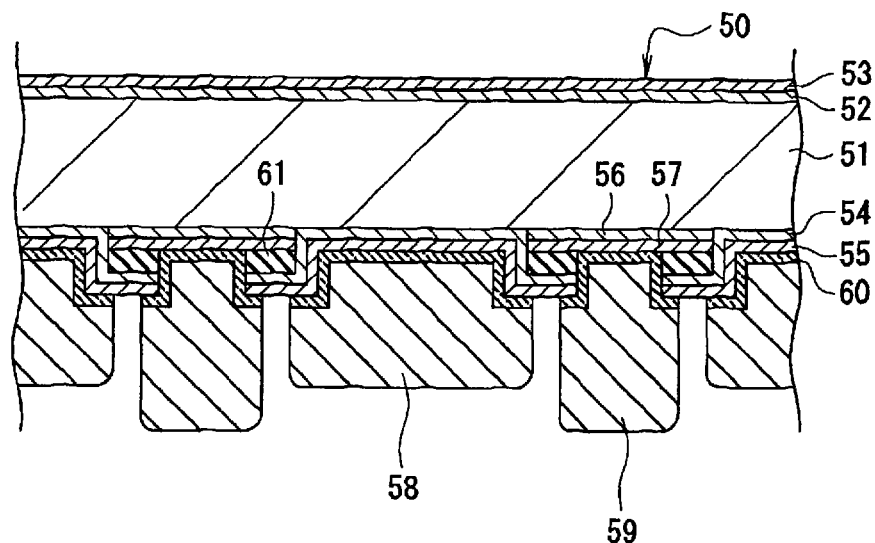
FIG. 10 Cross sectional view illustrating a modification example of a photoelectric conversion unit in an example solar cell module according to the embodiment of the present disclosure.

For example, as illustrated in FIG. 10, there may be employed a photoelectric conversion unit 50 including an i-type amorphous silicon layer 52 and an n-type amorphous silicon layer 53 that are sequentially formed on the light-receiving surface side of a substrate 51 formed of an n-type single crystalline silicon and so on, and further including a p-type region formed of an i-type amorphous silicon layer 54 and a p-type amorphous silicon layer 55 and an n-type region formed of an i-type amorphous silicon layer 56 and an n-type amorphous silicon layer 57 that are formed on the backside surface side of the substrate 51.

In the photoelectric conversion unit 50, the electrodes are provided only on the back surface side of the substrate 51. The electrodes include a p-side current-collecting electrode 58 formed on the p-type region and an n-side current-collecting electrode 59 formed on the n-type region. Further, a transparent conductive layer 60 is formed between the p-type region and the p-side current-collecting electrode 58 and between the n-type region and the n-side current-collecting electrode 59. An insulating layer 61 is formed between the p-type region and the n-type region. In this case, when forming a module, a wiring member 15 is mounted on each of the p-side current-collecting electrode 58 and the n-side current-collecting electrode 59.

Figure 11:
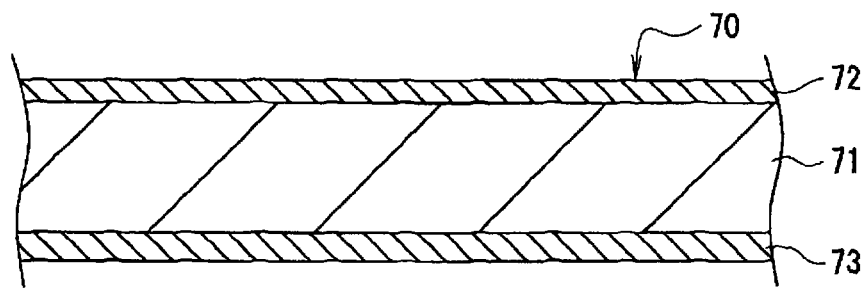
FIG. 11 Cross sectional view illustrating a modification example of a photoelectric conversion unit in an example solar cell module according to the embodiment of the present disclosure.

Further, as illustrated in FIG. 11, there may also be employed a photoelectric conversion unit 70 formed of a substrate 71 made of p-type polycrystalline silicon and so on, an n-type diffusion layer 72 formed on the light-receiving surface of the substrate 71, and an aluminum metal member 73 formed on the back surface side of the substrate 71.

The invention claimed is:

1. A solar cell module, comprising:
a plurality of solar cells wherein each solar cell comprises a photoelectric conversion unit and an electrode formed on the photoelectric conversion unit; and
a wiring member mounted on the electrode using an adhesive, the wiring member extending in an extension direction and having a width in a width direction, wherein the extension direction and the width direction are coplanar with a light receiving surface of the photoelectric conversion unit and the width direction is perpendicular to the extension direction, and the wiring member is structured to connect to another solar cell of the plurality of solar cells, the adhesive being provided in an immediately below region between the wiring member and the light receiving surface of the photoelectric conversion unit, the adhesive being further provided in a fillet partially covering a side surface of the wiring member and the light receiving surface of the photoelectric conversion unit, the immediately below region comprising a plurality of voids substantially empty of solid matter in the adhesive, and the plurality of voids being surrounded by the adhesive; and wherein a density of the plurality of voids in a central portion of the immediately below region in the width direction is higher than a density of the plurality of voids in an outer portion of the immediately below region in the width direction.

2. The solar cell module according to claim 1, wherein the electrode includes a bus bar electrode having a width which is smaller than the width of the wiring member, the wiring member being mounted on the bus bar electrode, and the adhesive being provided between the wiring member and the bus bar electrode, and the plurality of voids are formed in the adhesive between the wiring member and the light receiving surface of the photoelectric conversion unit.

3. The solar cell module according to claim 2, wherein the plurality of voids are formed along an edge of the bus bar electrode.

4. The solar cell module according to claim 1, wherein the wiring member includes projections and depressions on a surface thereof opposite the electrode, and the plurality of voids are formed between the electrode and the depressions.

5. The solar cell module according to claim 2, wherein the wiring member includes projections and depressions on a surface thereof opposite the electrode, and the plurality of voids are formed between the electrode and the depressions.

6. The solar cell module according to claim 3, wherein the wiring member includes projections and depressions on a surface thereof opposite the electrode, and the plurality of voids are formed between the electrode and the depressions.

* * * * *